(12) United States Patent
Verghese et al.

(10) Patent No.: US 7,310,792 B2
(45) Date of Patent: Dec. 18, 2007

(54) METHOD AND SYSTEM FOR MODELING VARIATION OF CIRCUIT PARAMETERS IN DELAY CALCULATION FOR TIMING ANALYSIS

(75) Inventors: Nishath K. Verghese, Sunnyvale, CA (US); Hong Zhao, Fremont, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 333 days.

(21) Appl. No.: 11/014,096

(22) Filed: Dec. 15, 2004

(65) Prior Publication Data

US 2005/0278671 A1 Dec. 15, 2005

Related U.S. Application Data

(60) Provisional application No. 60/580,292, filed on Jun. 15, 2004.

(51) Int. Cl.
*G06F 17/50* (2006.01)
(52) U.S. Cl. .................... 716/6; 716/4; 716/5
(58) Field of Classification Search ............ 716/5–6, 716/1, 4; 703/2
See application file for complete search history.

(56) References Cited

U.S. PATENT DOCUMENTS

| | | | |
|---|---|---|---|
| 5,675,502 A | 10/1997 | Cox | |
| 5,841,672 A | 11/1998 | Spyrou et al. | |
| 6,047,247 A | 4/2000 | Iwanishi et al. | |
| 6,269,467 B1 | 7/2001 | Chang et al. | |
| 6,314,546 B1 | 11/2001 | Muddu | |
| 6,476,635 B1 | 11/2002 | Rahim et al. | |
| 6,721,929 B2 * | 4/2004 | Li et al. ........................ | 716/6 |
| 6,894,547 B2 * | 5/2005 | Takahashi .................. | 327/170 |
| 2004/0249588 A1 * | 12/2004 | Shimazaki et al. .......... | 702/66 |

OTHER PUBLICATIONS

Daga, J.M. et al. "Temperature Effect on Delay for Low Voltage Applications" Proceedings of the Conference on Design, Automation and Test in Europe (date '98), 1998, 6 pgs.

Kahng, A.B. et al. "Efficient Gate Delay Modeling for Large Interconnect Loads" Proceedings of the 1997 International Conference on Computer Design (ICCD'97) VLSI in Computers and Processors, Oct. 12-15, 1997, pp. 532-541.

Shepard, K.L. "Practical Issues of Interconnect Analysis in Deep Submicron Integrated Circuits" Proceedings of the 1996 IEEE Multi-Chip Module Conference (MCMC-96), Feb. 6-7, 1996, pp. 202-207.

\* cited by examiner

*Primary Examiner*—Vuthe Siek
(74) *Attorney, Agent, or Firm*—Bingham McCutchen LLP

(57) ABSTRACT

A system, method, and computer program accurately models circuit parameter variation for delay calculation. For any given circuit parameter value, a cell is characterized at just three values in the circuit parameter range. An interpolation process generates an equation to calculate delay using the characterization data from the three circuit parameter values. This delay equation calculates the delay for any value in the circuit parameter range. Similar methodology is used to model simultaneous variation of two circuit parameters. The cell is characterized at just six circuit parameter pairs to interpolate the delay equation for any circuit parameter pair in the characterized ranges. This methodology can be extended to accommodate variation of multiple circuit parameters using similar interpolation techniques.

41 Claims, 10 Drawing Sheets

METHOD AND SYSTEM FOR MODELING VARIATION OF CIRCUIT PARAMETERS IN DELAY CALCULATION FOR TIMING ANALYSIS

CROSS-REFERENCED AND RELATED APPLICATIONS

This application claims benefit from Provisional Application Ser. No. 60/580,292 filed Jun. 15, 2004, which is hereby incorporated by reference, as if fully set forth herein.

BACKGROUND

The embodiments described herein are related to electronic design automation tools, and more particularly to calculating timing characteristics (e.g., output delay and slew) of a circuit while modeling variations in circuit parameters, such as a voltage supply, temperature, and process parameters.

One aspect of integrated circuit design involves determining timing parameters and power consumption to characterize the chip. Currently, large scale integration ("LSI") designs are transitioning from deep submicron to ultra deep submicron ("DSM/UDSM") feature sizes. With this transition, timing and power verification becomes more critical to achieve high electrical performance with complex integrated circuit designs. In addition to feature sizes, the accuracy of timing and power verification is also critical due to the ever-increasing size of integrated circuit designs. Furthermore, fast and accurate power and timing verification techniques are critical to meet the time to market product window demands on today's integrated circuit designs.

In general, the timing parameters define how signals propagate from one section of the chip to another. For example, timing parameters define rising signal and falling signal propagation times from driver circuits to receiver circuits in large scale integration ("LSI") circuits. Currently, timing and power information is generated based on instance-based delay and power calculation. The delay and power calculation is formulated from a fixed library. Specifically, the library defines the pin-to-pin delay and output rise and fall times from a fixed reference lookup table of input signal slew rates and output loading capacitances. Using a fixed base library, output rise and fall times are specified based on input signal slew rates and fixed output loading capacitances.

Using conventional methods to generate a library for timing verification, a load capacitance and input signal slew rate are used to derive the change of output voltage from the change of input voltage. However, this simple technique does not account for circuit level and device level non-linear characteristics. To further simplify the analytical requirements, the output signal curve is specified as a linear sweep. With the continuing rapid advances in lithography, and as transistor dimensions become smaller, this output signal curve is dominated to a much larger extent by the transistors' nonlinear region of operation. Operation of the transistors in the nonlinear region is a result of the transistor switching speed in CMOS circuits.

This technique causes errors in computing both the driving instance delay and the RC network propagation delay. Specifically, these linear sweep techniques cannot match actual signal curves and thus introduce unacceptable error for the delay calculation. In addition, resistive shielding effects are also not properly handled with the linear sweep technique. The resistive shielding effects are caused by the resistive element in the RC network. Using these techniques, the actual signal delay may be significantly different then the delay predictions. Accordingly, related U.S. Pat. No. 6,721,929 entitled "High Accuracy Timing Model for Integrated Circuit Verification" which is hereby incorporated by reference as if fully set forth herein, discloses a new driving methodology that properly calculates delay and power results to accurately reflect the nonlinear behavior particularly found in DSM/UDSM designs.

Another aspect of integrated circuit design involves accommodating changes in circuit parameters such as supply voltage, temperature, and process. For example, in the case of varying supply voltage, instances of the same cell may be used in different parts of a circuit with different supply voltages. The same circuit may be used for different functions depending on a particular application, and thus, require a different supply voltage or a range of supply voltages. Thus the circuit response to each value in supply voltage range must be analyzed. Process represents a collection of parameters including oxide thickness (tox), threshold voltage (Vt), transistor width (W), and transistor length (L). Each value of process is associated with a particular set of parameter values, one value for each parameter in the collection.

There is a need in circuit design to efficiently model timing characteristics of a cell when the cell must accommodate one or more circuit parameters that can vary within a given range. For the purposes of explanation, this description will use the embodiment of supply voltage variation and the embodiment of simultaneous variation of supply voltage and temperature as examples.

The conventional method of modeling supply voltage variation on delay is Linear Derating of the delay based on the supply voltage. Historically, delay at a given supply voltage is calculated by multiplying the known delay at a pre-characterized voltage by a constant "K-factor", as shown in the following equation:

$$\text{delay}(V2) = \text{delay}(V1) * (1 + K(V2 - V1))$$

The V1 voltage is the operating condition at which the delay table in the library file is characterized. The K-factor must have been characterized in the library for the calculation to be effective. Linear derating of delay with supply voltage can lead to inaccuracies in the calculated delay as the supply voltage is decreased.

Another approach for modeling supply voltage variation would be to use the circuit characterization model found in U.S. Pat. No. 6,721,929 for each supply voltage value in the range. Disclosed in U.S. Pat. No. 6,721,929 is a variable current source model that accurately determines timing delays for designs of circuits implemented in integrated circuits. A design for an integrated circuit specifies a resistive-capacitive ("RC") network, such as a wiring network that interconnects circuits in an integrated circuit. The RC network couples a driving point and a receiving point. A circuit specified in the design, such as a gate level circuit implemented in a standard cell, drives the RC network at the driving point. The variable current source model determines driving currents for the circuit at the driving point based on the RC network and a characterization of the circuit. A timing delay between the driving point and the receiving point is determined by simulating the drive of the RC network with the driving current at the driving point. A circuit characterization model is generated to determine, for each time instance, a new drive current from the drive voltage and the load capacitance from a prior time instance.

The circuit characterization model depicts relationships among input signal slew rates, load capacitances, drive currents, and drive voltages for the circuit in the form of a characterization library. Each element in the characterization library stores an eleven element array for each slew and load capacitance parameters of the cell. Each array stores the output delay value and ten points on the output waveform.

A library of characterization data for each voltage value in the range would be stored for every cell. While this approach would be accurate, it needlessly burdens the memory requirements of a system and would require every cell to be characterized for every supply voltage value it could be operated under. A more accurate and efficient method of modeling voltage variation for delay calculation with variation in circuit parameters is needed.

SUMMARY

The embodiments described herein are related to electronic design automation tools, and more particularly to modeling variation of circuit parameters in delay calculations for timing analysis. Timing characteristics (e.g., output delay and slew) of a circuit are calculated while modeling variations in circuit parameters such as voltage supply, temperature, and process parameters. Example process parameters include: oxide thickness (tox), threshold voltage (Vt), transistor width (W), and transistor length (L). The method and mechanism for modeling variations in circuit parameters in delay calculations for timing analysis includes identifying one or more inputs, characterizing the circuit at known parameter values within the range, interpolating using the resulting circuit characterizations to derive the equation for calculating the output waveform and the delay, and calculating the waveform and the delay at any circuit parameter value within the range.

DETAILED DESCRIPTION OF INVENTION

A system, method, and computer program product for modeling variation in circuit parameters for delay calculation for timing analysis is described. Timing characteristics (e.g., output delay and slew) of a circuit are calculated while modeling variations in circuit parameters such as voltage supply, temperature, and process parameters (e.g., oxide thickness (tox), threshold voltage (Vt), transistor width (W), and transistor length (L)). The method and mechanism for modeling variations in circuit parameters in delay calculations for timing analysis includes: identifying one or more inputs, characterizing the circuit at known parameter values within the range, interpolating using the resulting circuit characterizations to derive the equation for calculating the output waveform and the delay, and calculating the waveform and the delay at any circuit parameter value within the range.

In the following description, for the purposes of explanation, numerous specific details are set forth in order to provide a thorough understanding. It will be apparent, however, to one skilled in the art that the present embodiments may be practiced without these specific details. In other instances, well-known structures and devices are shown in block diagram form in order to avoid unnecessarily obscuring the important aspects.

Figure 1A:
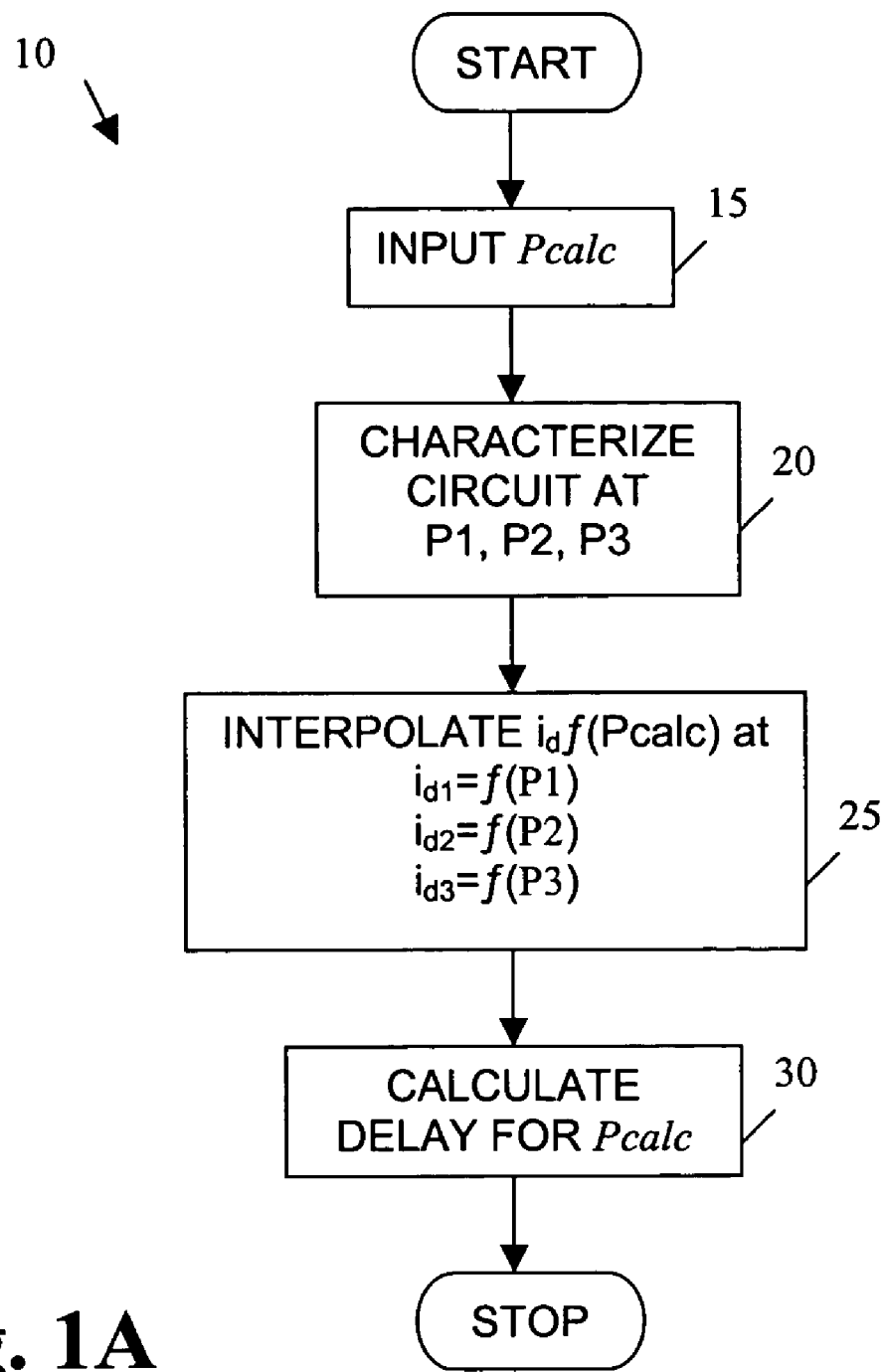
FIG. 1A is a flowchart of a process of modeling circuit parameter variation in delay calculation for timing analysis.

Process 10 in FIG. 1A represents an embodiment for modeling variation of a circuit parameter for delay calculation. Circuit parameter Pcalc is received as input in Process action (15), where Pcalc is a value within the range of Pmin to Pmax for which timing characteristics are desired. Process action (20) characterizes a circuit resulting in a library of characterization data for each of three values of the circuit parameter (P1, P2, P3) in the circuit parameter range Pmin to Pmax. Process action (25) represents the interpolation process, which uses the characterization data for three values of the circuit parameter (P1, P2, P3) to create a delay equation that will calculate the delay for any value of the circuit parameter in the range. Process action (30) uses the created delay equation to calculate the delay and slew for any circuit parameter value in the range. Using this methodology, the output delay and slew can be efficiently interpolated for any circuit parameter value in the range by characterizing just three values in the circuit parameter range.

In another embodiment, a circuit is characterized using two circuit parameters varying simultaneously, resulting in six libraries of characterization data. The interpolation process in this other embodiment generates an equation to calculate the output delay and slew value for any pair of process parameters in the characterized ranges using just the six characterized libraries.

In another embodiment, more than two parameters can be varied using this interpolation methodology and a fixed number of characterization libraries with an appropriate analytical equation for current as a function of these parameters.

Figure 1B:
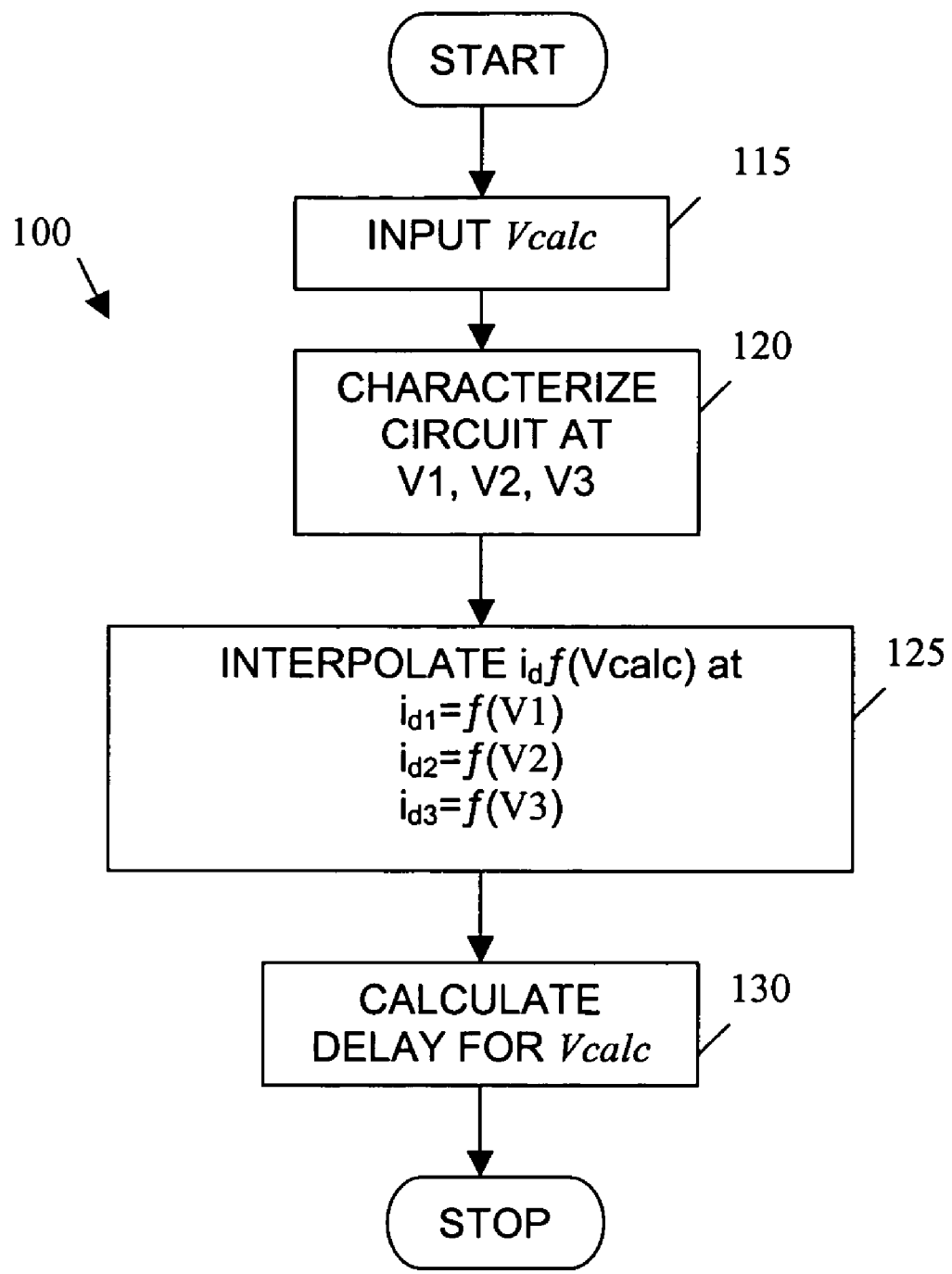
FIG. 1B is a representation of the embodiment of modeling the circuit supply voltage variation in delay calculation for timing analysis.

In one embodiment, supply voltage is varied within a given range. Process 100 in FIG. 1B shows an overview of the embodiment for modeling voltage variation in delay calculation for timing analysis. Circuit parameter Vcalc is received as an input in Process action (115) where Vcalc is a value within the range of Vmin to Vmax for which timing characteristics are desired. Process action (120) characterizes a circuit, resulting in a library of characterization data for each of three voltage values (V1, V2, V3) in a supply voltage range Vmin to Vmax for a cell. The characterization data depicts relationships between input signal slew rates, load capacitances, drive currents, and drive voltages for the cell. Process action (125) represents the interpolation process, which uses the characterization data for the three supply voltage values to create a delay equation where current is a function of supply voltage that will calculate the delay for any supply voltage value in the range. Process action (130) uses the created delay equation to calculate the delay and slew for any voltage value in the supply voltage range. Using this methodology, the output delay and slew can be efficiently interpolated for any supply voltage value in the supply voltage range by characterizing at just three voltage values in the supply voltage range.

In another embodiment, a circuit is characterized using a variable temperature parameter in addition to a variable voltage parameter resulting in six libraries of characterization data. The interpolation process generates an equation to calculate the output delay and slew value for any pair of voltage and temperature in the characterized ranges using just the six characterization libraries.

For both single circuit parameter variation (using 3 characterization libraries) and simultaneous two circuit parameter variation (using 6 characterization libraries), the interpolated output slew and delay values are accurate to within 3% of SPICE analysis for both a single cell analysis and for multiple cell analysis.

Characterization

Figure 2A:
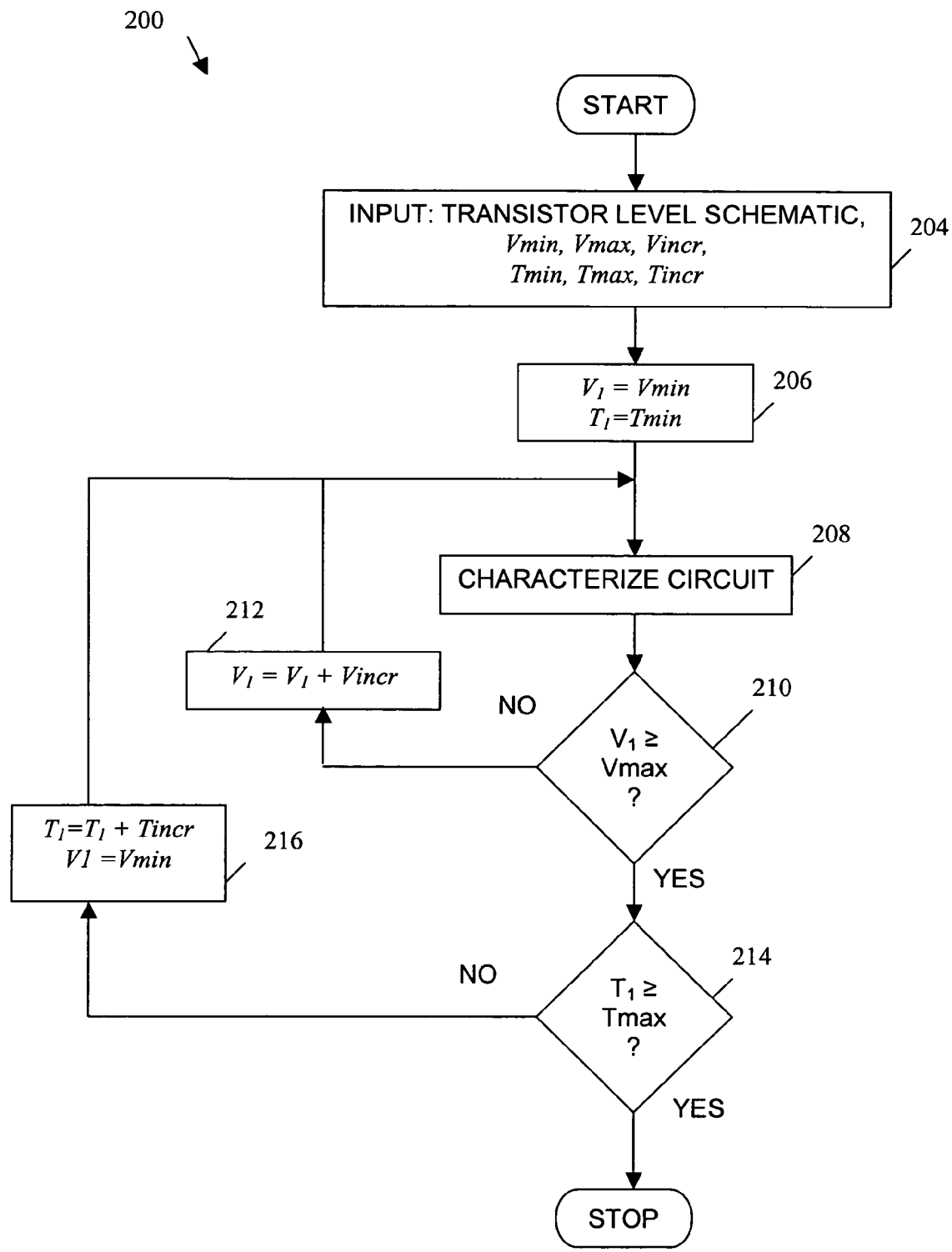
FIG. 2A is a flowchart of the characterization process for the embodiment of modeling both voltage variation and temperature variation in delay calculation for timing analysis.
Figure 5:
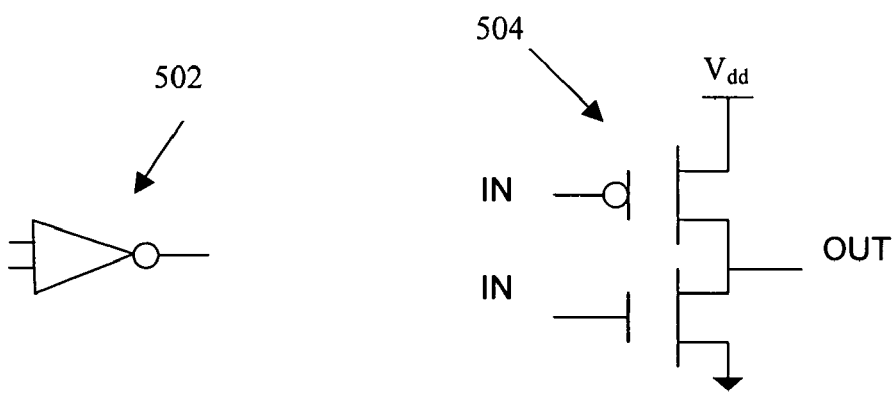
FIG. 5 is a representation of an inverter shown in a gate level schematic and in a transistor level schematic.

FIG. 2A is a flowchart of a process for performing circuit characterization in an embodiment involving voltage variation and temperature variation for delay calculation. A transistor level schematic, such as element 504 in FIG. 5, is received as input along with the three voltage and three temperature parameters in process action (204). In this example, the voltage and temperature parameters are set as follows:

$Vincr=(Vmax-Vmin)/2$ and $Tincr=Tmax-Tmin$ where Vmin and Vmax are the endpoints of the voltage range, and Tmin and Tmax are the endpoints of the temperature range. For example, if Vmax=1.2, Vmin=0.4, Tmax=400, and Tmin=200, then Vincr=0.4 and Tincr=200. Note that, any values in the ranges can be selected for Vmin, Vmax, Tmin, and Tmax and any increment value can be selected for Vincr and Tincr.

Figure 3A:
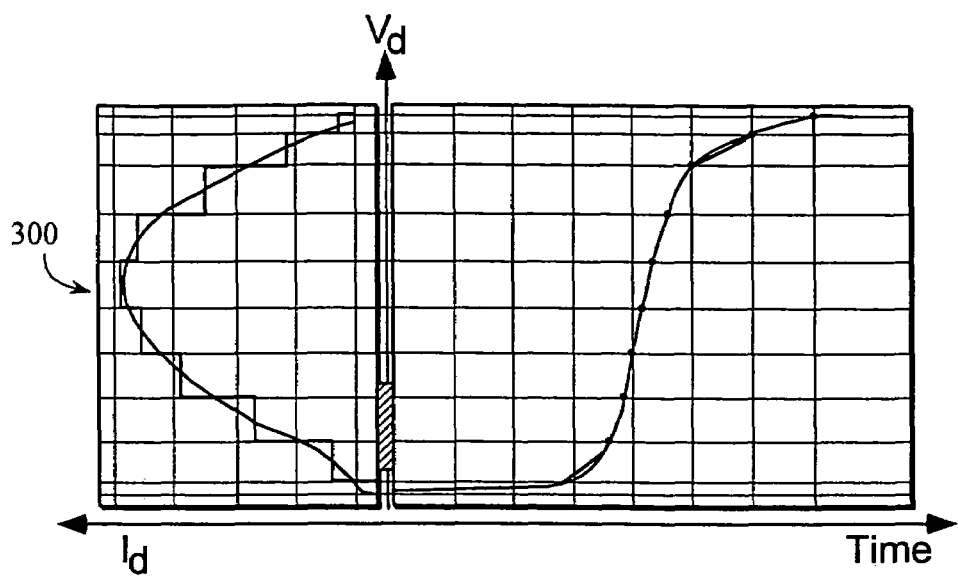
FIG. 3A is a graphic representation of an output waveform V vs. I for an example gate level circuit.
Figure 6:
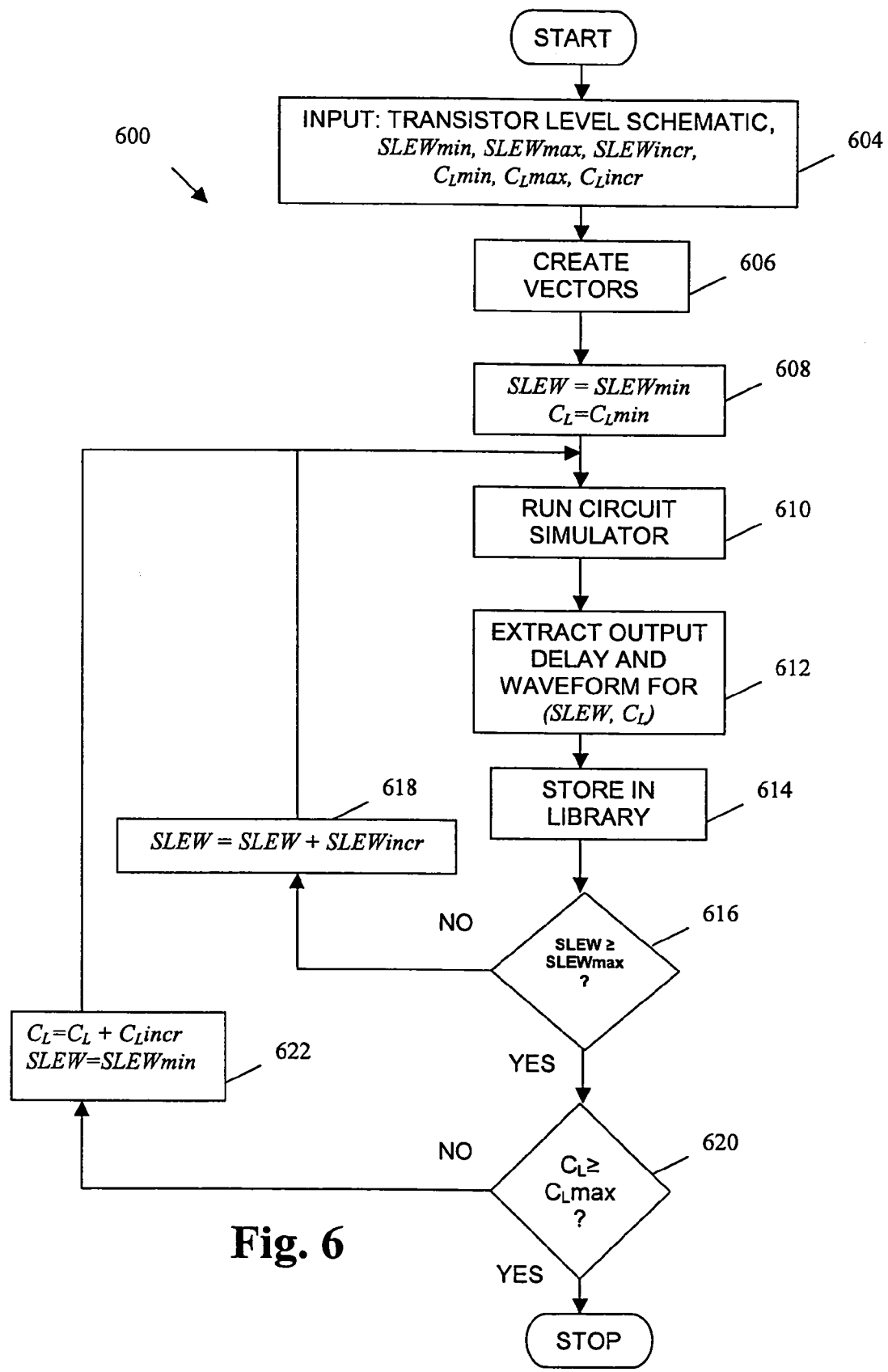
FIG. 6 is a flowchart of the underlying circuit characterization process.

Process action (206) sets the initial values of $V_1$ and $T_1$ to Vmin (0.4) and Tmin (400), respectively. The transistor level schematic received as input is used in process action (208) during characterization. The characterization process 600 is shown in FIG. 6. During characterization, input are received in process action (604). The input states are defined in process action (606) and slew and load are initialized in Process action (608). The process conducts an analysis on transistor level circuits (e.g., inverter 504 in FIG. 5, where $V_{dd}$ is the supply voltage) in order to characterize the circuit for use in timing and power calculations in process action (610). Specifically, output voltage verse current characterization is defined for multiple input slew rates for input voltages, $V_{IN}$, and multiple load capacitances, $C_L$. FIG. 3A illustrates a V-I curve for an example gate level circuit. The vertical axis plots the output voltage, $V_d$, and the horizontal axis, extending to the left, plots current, $I_d$. As shown by the example plot in FIG. 3A, as the voltage, Vd increases from 0 volts, the current increases to a point, label 300 in FIG. 3A. At point 300, the current begins to decrease as the voltage increases. FIG. 3A also plots the voltage, $V_d$, with respect to time.

Figure 3B:
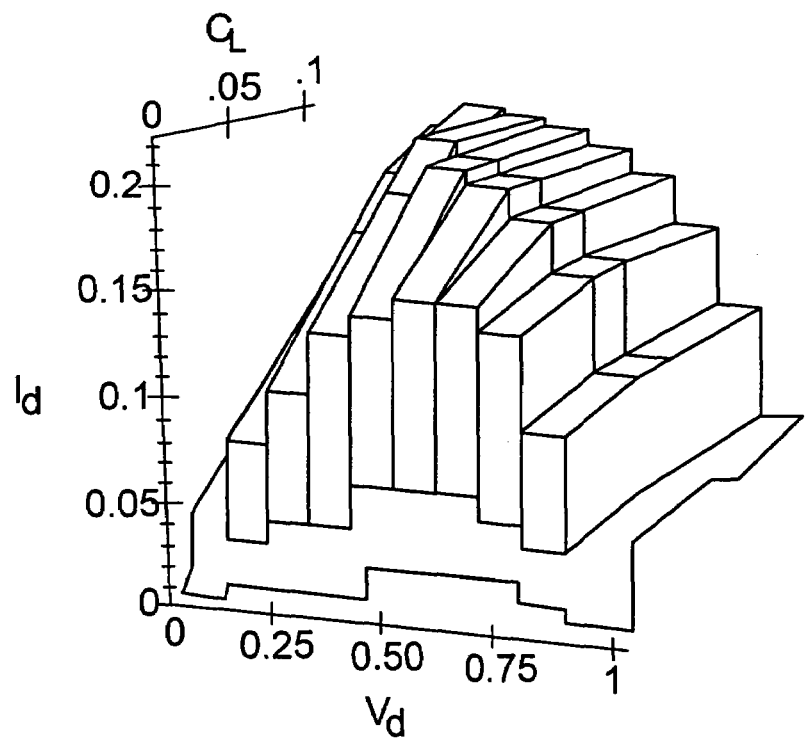
FIG. 3B is a graphic representation of the relationship between driver voltage, Vd, driver current, Id, and load capacitance, $C_L$.

FIG. 3B illustrates a three dimensional graph that depicts an example relationship between output voltage, $V_d$, current, $I_d$, and load capacitance, $C_L$. As shown in the three dimensional graph of FIG. 3B, the current, Id, is dependent upon both the voltage, $V_d$, and the load capacitance, $C_L$. In addition, the current, $I_d$, voltage, $V_d$, and the load capacitance, $C_L$ are dependent upon input signal slew rates (not shown). The data depicted in FIG. 3B is generated for multiple signal slew rates. The graphic in FIG. 3B is a representation of data referred to herein as the "Circuit Model Characterization Data." For each value of load capacitance, $C_L$, ten points on the I/V curve are extracted in process action (612) in FIG. 6 and stored along with delay as an eleven element array in process action (614). Multiple slew and load pairs are characterized by looping through process actions (616), (618), (620), and (622).

Figure 4:
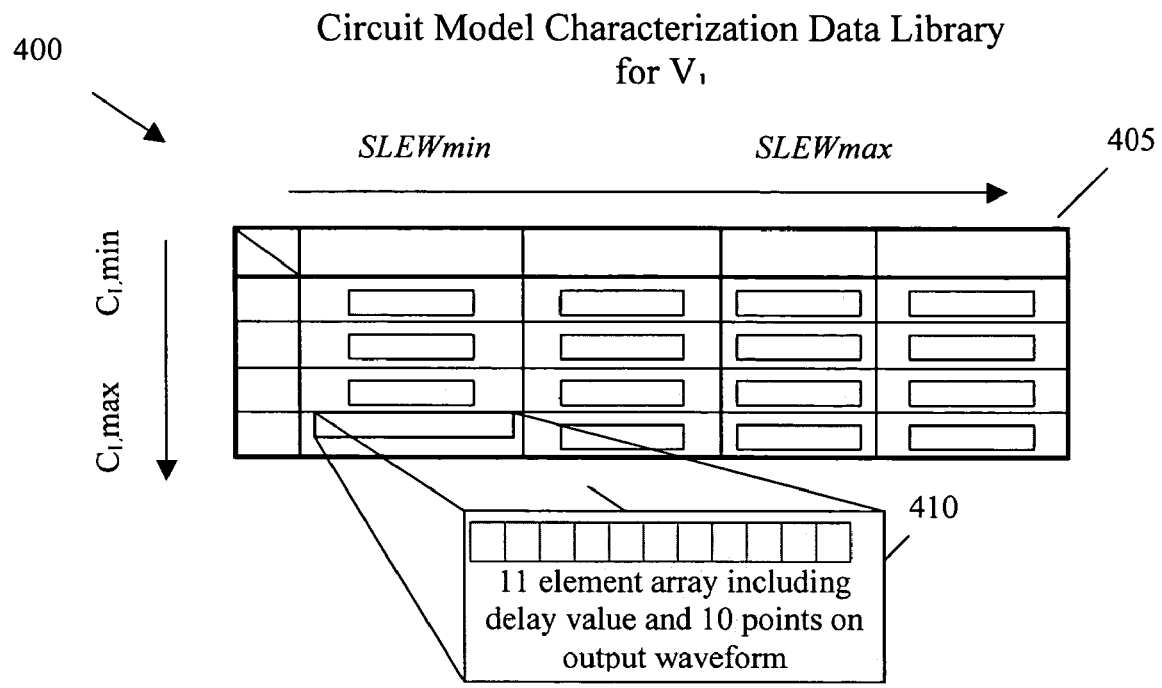
FIG. 4 is a representation of a library of Circuit Model Characterization Data.

The Circuit Model Characterization Data for multiple signal slew rates is referred to herein as a library of the Circuit Model Characterization Data for voltage $V_1$. A representation of Circuit Model Characterization Data Library 400 is shown in FIG. 4. The Circuit Model Characterization Data Library can be represented by a table 405 of slew values vs. load capacitance values. Each element 410 in the table stores a circuit characterization for a circuit parameter such as voltage represented by an eleven element array. The process generates Circuit Model Characterization Data for each input to output pin pairs of gate level circuit employed in an IC design under analysis.

In one embodiment, SPICE or HSPICE is used to generate the Circuit Model Characterization Data. For this embodiment, the gate level circuit is simulated, using HSPICE software, to generate the V-I relationships for multiple input signal slew rates and multiple load capacitances. Although the present embodiment is described using HSPICE to generate the Circuit Model Characterization Data, any circuit simulation technique may be used without deviating from the spirit or scope. Further details regarding circuit characterization are explained in the disclosure of related U.S. Pat. No. 6,721,929.

Process action (210) determines if the voltage used to analyze the circuit was the maximum voltage in the specified range. If not, the voltage in increased by Vincr in process action (212) and the circuit is characterized again (208) using the new voltage value and the same temperature value. This characterization results in the creation of an additional library of Circuit Model Characterization Data, such as, for example, that shown in FIG. 4. Using the example values, the circuit is characterized at V1=0.4. Since this is not the maximum of the range, V1 is incremented by Vincr=0.4 in process action (212) to create a characterization of the circuit at V1=0.8. Process action (210) and (212) increment V1 again by Vincr=0.4 to characterize the circuit at a V1=1.2. When process action (210) determines that the voltage used in the analysis is greater than or equal to the maximum voltage in the range, process action (214) determines if the temperature used to analyze the circuit is greater than or equal to the maximum temperature for the specified range. Using the example values, the temperature is increased by a Tincr of 200, and V1 is reset to Vmin (0.4) in process action (216). The circuit is then re-characterized (208) cycling through all the voltage values (0.4, 0.8, 1.2) set by the voltage parameters. If process action (214) determines that the temperature used in the analysis is equal to or greater than the maximum temperature, the characterizing process stops.

Circuit Model Characterization Data Libraries are generated for each voltage and temperature pair used in the analysis of the circuit. In this example, the temperature parameters specified Tmax−Tmin=Tincr (400−200=200) and the voltage parameters specified (Vmax−Vmin)/2=Vincr ((1.2−0.4)/2=0.4) result in the creation of 6 libraries, one for each of the following temperature voltage pairs:

| Voltage Temperature pair | Example values |
|---|---|
| (Tmin, Vmin) | (200, 0.4) |
| (Tmin, Vmin + Vincr) | (200, 0.8) |
| (Tmin, Vmin + 2Vincr or Vmax) | (200, 1.2) |
| (Tmax, Vmin) | (400, 0.4) |
| (Tmax, Vmin + Vincr) | (400, 0.8) |
| (Tmax, Vmin + 2Vincr or Vmax) | (400, 1.2) |

Figure 2B:
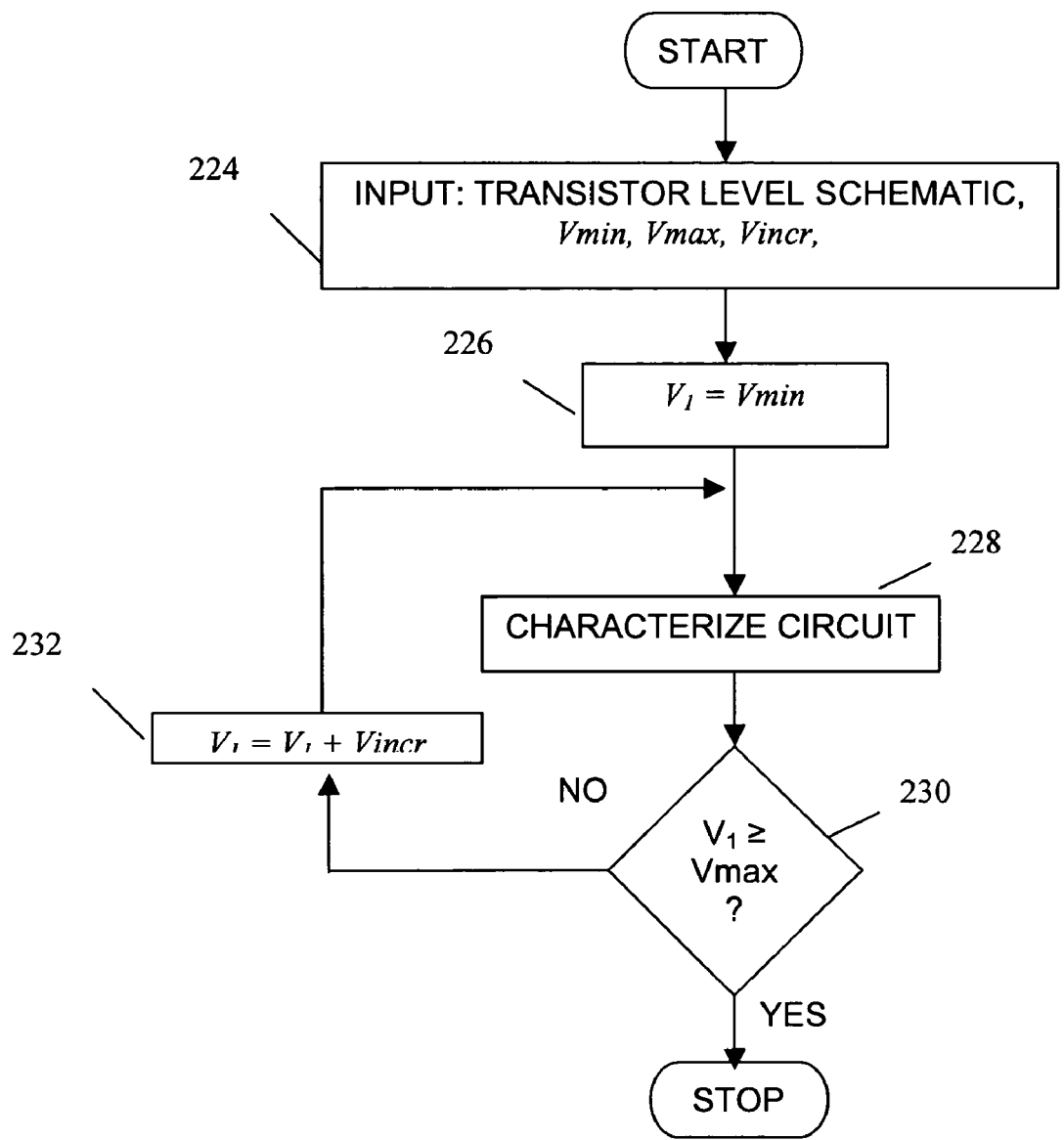
FIG. 2B is a flowchart of the characterization process for the embodiment of modeling voltage variation in delay calculation for timing analysis.

FIG. 2B represents an embodiment of the characterization process of only voltage variation in delay calculation for timing analysis. This process functions similarly to FIG. 2A. Inputs of Vmin, Vmax and Vincr are received in Process action (224). V1 is initialized in process action (226). The circuit is characterized as explained in the discussion of FIG. 6 in process action (228). other values of supply voltage are characterized by looping through process actions (230) and (232).

Interpolation and Delay Calculation

Figure 7A:
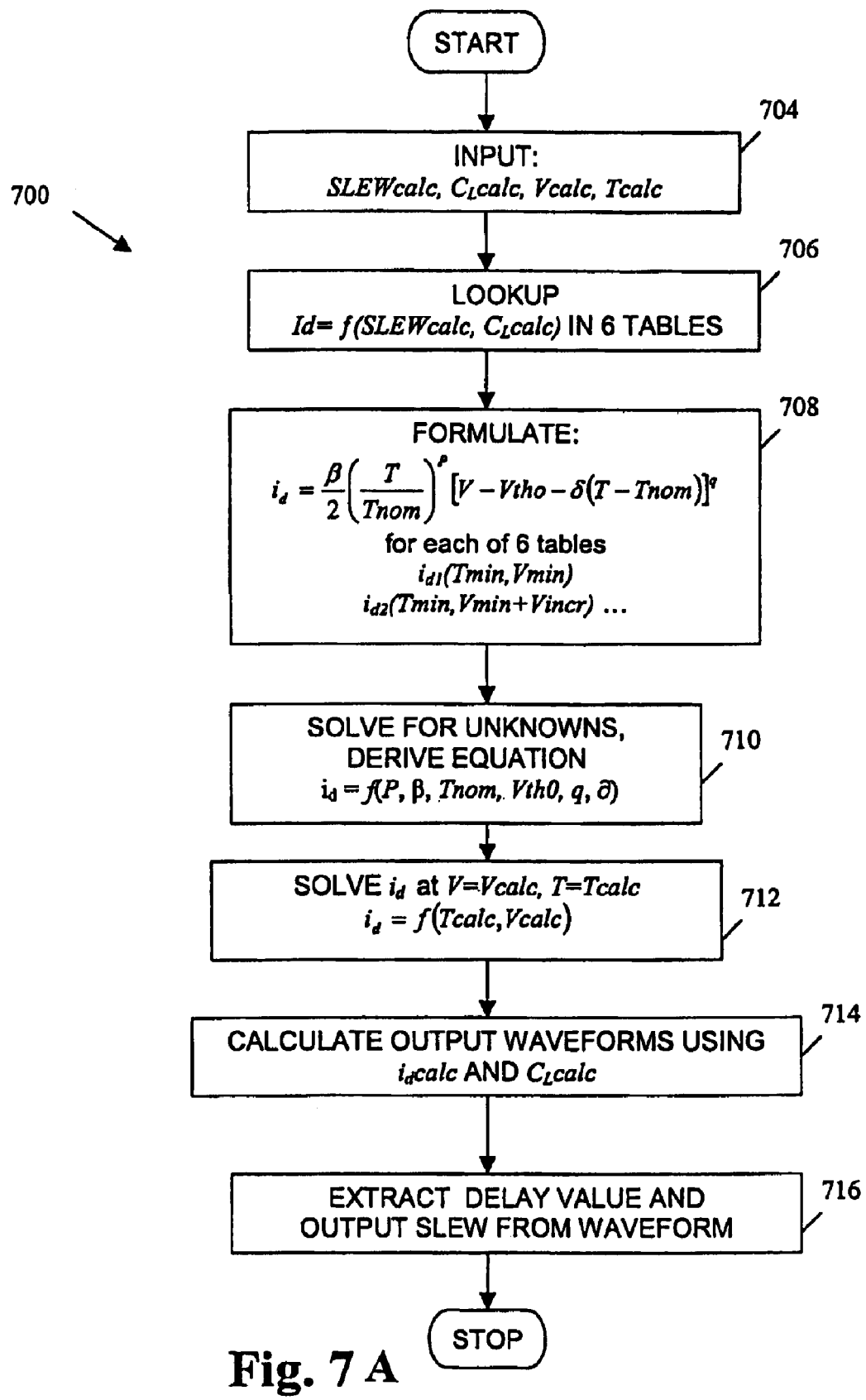
FIG. 7A. is a flowchart of the interpolation process of the embodiment modeling both voltage variation and temperature variation.

Interpolation process 700 is shown in FIG. 7. Process action (704) receives input parameters slew (SLEWcalc), load ($C_L$calc), voltage (Vcalc), and temperature (Tcalc). Process action (706) uses the slew and load values to look up the current, $I_d$, in each of the six Circuit Model Characterization Data Libraries generated by the characterization process. Based on the $I_d$ values obtained from the six characterization libraries, process action (708) formulates an $i_d$ using the equation below for each of the six libraries.

$$i_d = \frac{\beta}{2}\left(\frac{T}{Tnom}\right)^P [V - Vtho - \delta(T - Tnom)]^q$$

Process action (710) solves the set of six equations of $i_d$ to find the values of the unknown coefficients (P, β, Tnom, Vth0, q, δ) in the equation. With the values of the unknowns resolved, the equation is derived. Using the derived equation, $i_d$ is calculated using Tcalc and Vcalc in process action (712). This equation is used in process action (714) to calculate an output waveform using $i_d$calc and $C_L$calc. Process action (716) extracts the actual delay value and slew value from the output waveform. This interpolation technique can be used to find the output delay value and output slew value for any voltage and temperature in the characterized range without having to characterize each voltage and temperature combination. In other words, using the example values, the output slew and waveform can be obtained for any voltage and temperature pair from V=0.4-1.2 and T=200-400 by characterizing just 6 pairs of values in the characterized ranges.

Figure 8:
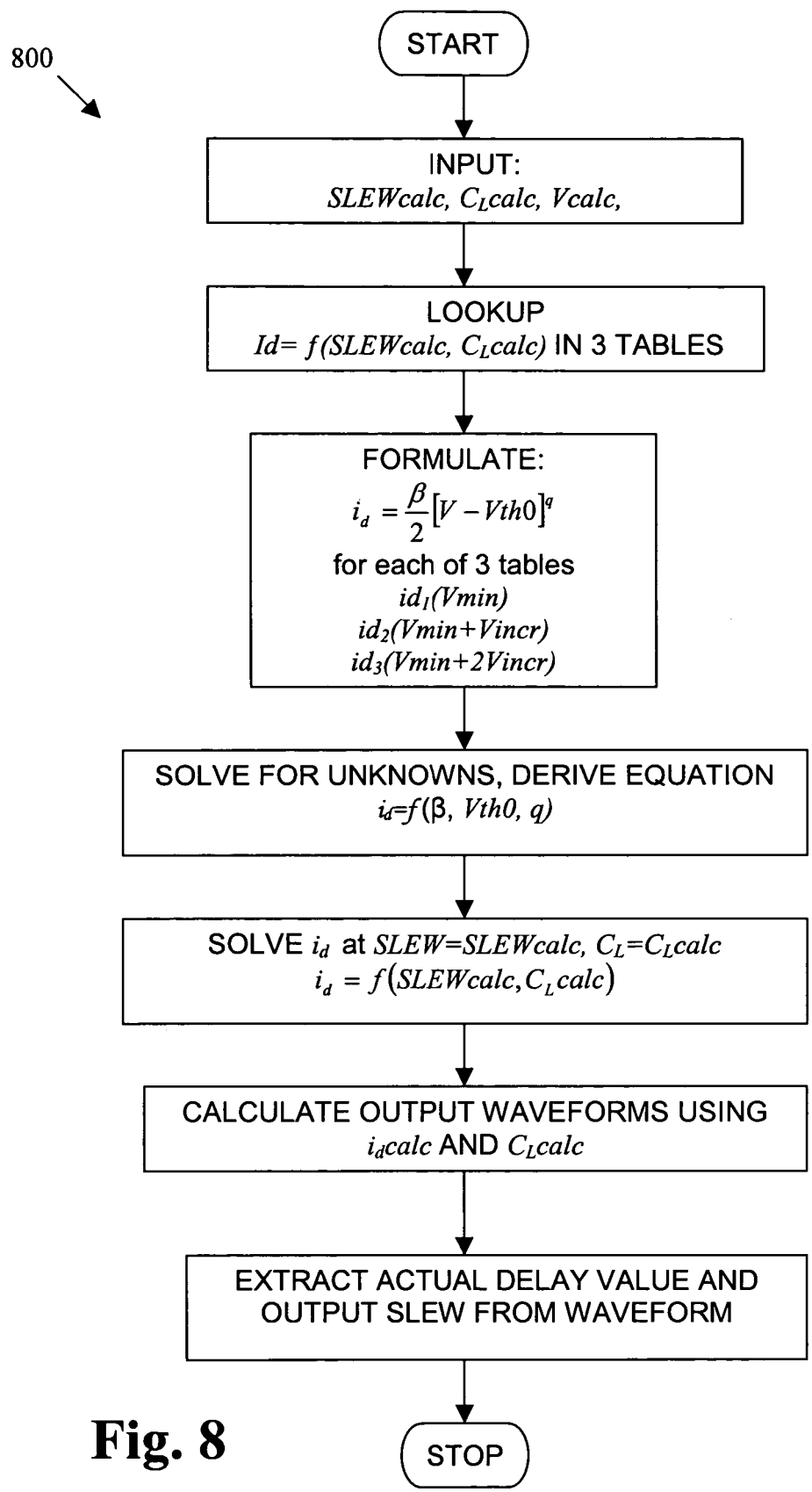
FIG. 8 is a flowchart of the interpolation process for the embodiment of modeling voltage variation.
Figure 9:
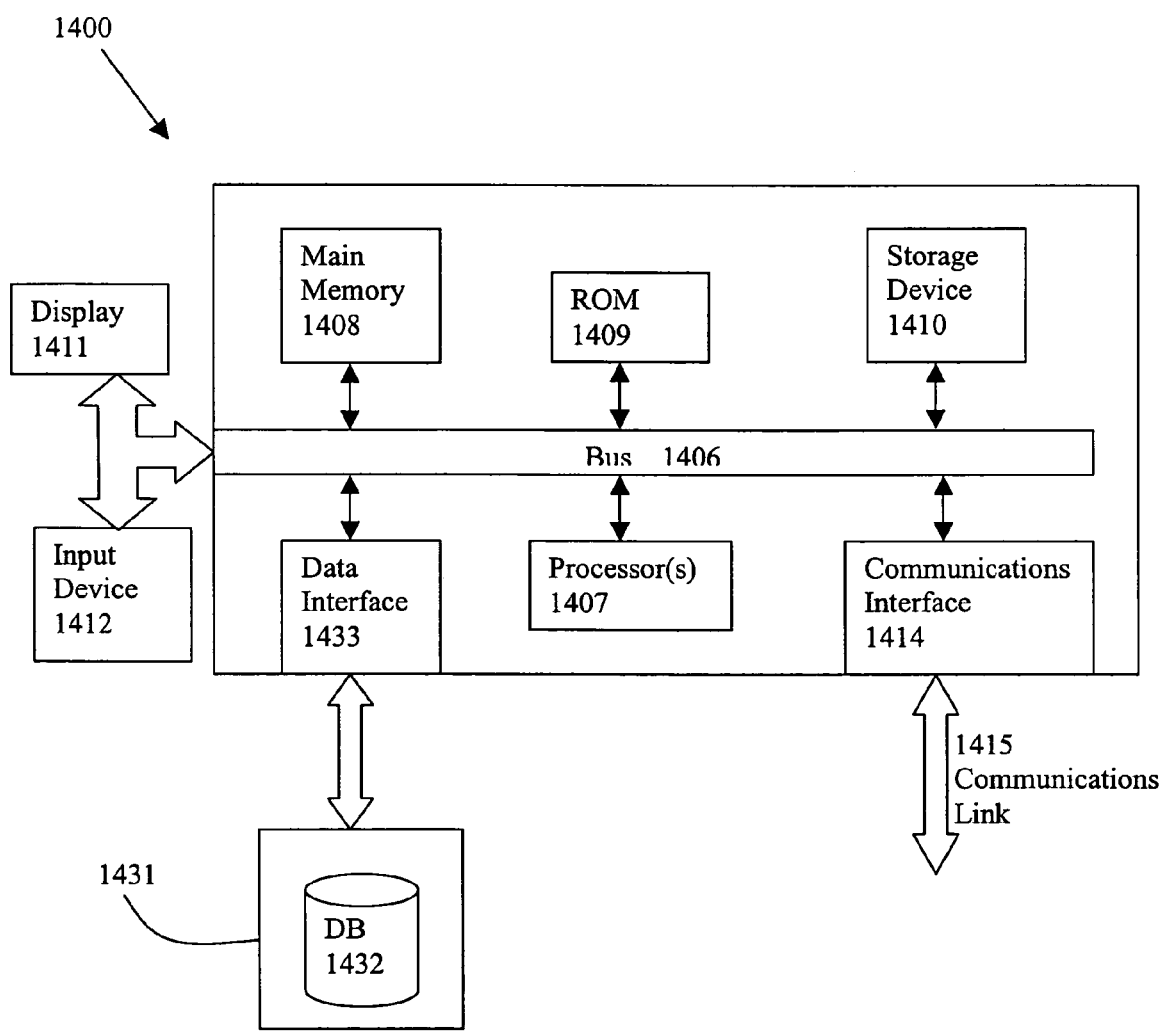
FIG. 9 is a representation of a general-purpose system on which to execute the method of circuit parameter variation for delay calculation.

FIG. 8 shows the interpolation process for the embodiment of a single process parameter variation, such as voltage variation. Note that there are three unknowns (β, Vth0, q) in the formulation equation $$i_d = \frac{\beta}{2}[V - V_{th0}]^q,$$

and therefore, only three libraries are required to interpolate the remaining voltage values in the range. Although the equation is different and only three libraries are required, the remaining details of the interpolation process remain the same as discussed for FIG. 7 above.

In another embodiment, more than two parameters can be varied using this interpolation methodology and a fixed number of characterization libraries with an appropriate analytical equation for current as a function of these parameters.

System Architecture Overview

The execution of the sequences of instructions required to practice the embodiments may be performed by a computer system 1400 as shown in FIG. 4. In an embodiment, execution of the sequences of instructions is performed by a single computer system 1400. According to other embodiments, two or more computer systems 1400 coupled by a communication link 1415 may perform the sequence of instructions in coordination with one another. Although a description of only one computer system 1400 will be presented below, however, it should be understood that any number of computer systems 1400 may be employed to practice the embodiments.

A computer system 1400 according to an embodiment will now be described with reference to FIG. 4, which is a block diagram of the functional components of a computer system 1400. As used herein, the term computer system 1400 is broadly used to describe any computing device that can store and independently run one or more programs.

Each computer system 1400 may include a communication interface 1414 coupled to the bus 1406. The communication interface 1414 provides two-way communication between computer systems 1400. The communication interface 1414 of a respective computer system 1400 transmits and receives electrical, electromagnetic or optical signals, that include data streams representing various types of signal information, e.g., instructions, messages and data. A communication link 1415 links one computer system 1400 with another computer system 1400. For example, the communication link 1415 may be a LAN, in which case the communication interface 1414 may be a LAN card, or the communication link 1415 may be a PSTN, in which case the communication interface 1414 may be an integrated services digital network (ISDN) card or a modem, or the communication link 1415 may be the Internet, in which case the communication interface 1414 may be a dial-up, cable or wireless modem.

A computer system 1400 may transmit and receive messages, data, and instructions, including program, i.e., application, code, through its respective communication link 1415 and communication interface 1414. Received program code may be executed by the respective processor(s) 1407 as it is received, and/or stored in the storage device 1410, or other associated non-volatile media, for later execution.

In an embodiment, the computer system 1400 operates in conjunction with a data storage system 1431, e.g., a data storage system 1431 that contains a database 1432 that is readily accessible by the computer system 1400. The computer system 1400 communicates with the data storage system 1431 through a data interface 1433. A data interface 1433, which is coupled to the bus 1406, transmits and receives electrical, electromagnetic or optical signals, that include data streams representing various types of signal information, e.g., instructions, messages and data. In embodiments, the functions of the data interface 1433 may be performed by the communication interface 1414.

Computer system 1400 includes a bus 1406 or other communication mechanism for communicating instructions, messages and data, collectively, information, and one or more processors 1407 coupled with the bus 1406 for processing information. Computer system 1400 also includes a main memory 1408, such as a random access memory (RAM) or other dynamic storage device, coupled to the bus 1406 for storing dynamic data and instructions to be executed by the processor(s) 1407. The main memory 1408 also may be used for storing temporary data, i.e., variables, or other intermediate information during execution of instructions by the processor(s) 1407.

The computer system 1400 may further include a read only memory (ROM) 1409 or other static storage device coupled to the bus 1406 for storing static data and instructions for the processor(s) 1407. A storage device 1410, such as a magnetic disk or optical disk, may also be provided and coupled to the bus 1406 for storing data and instructions for the processor(s) 1407.

A computer system 1400 may be coupled via the bus 1406 to a display device 1411, such as, but not limited to, a cathode ray tube (CRT), for displaying information to a user. An input device 1412, e.g., alphanumeric and other keys, is coupled to the bus 1406 for communicating information and command selections to the processor(s) 1407.

According to one embodiment, an individual computer system 1400 performs specific operations by their respective processor(s) 1407 executing one or more sequences of one or more instructions contained in the main memory 1408. Such instructions may be read into the main memory 1408 from another computer-usable medium, such as the ROM 1409 or the storage device 1410. Execution of the sequences of instructions contained in the main memory 1408 causes the processor(s) 1407 to perform the processes described herein. In alternative embodiments, hard-wired circuitry may be used in place of or in combination with software instructions. Thus, embodiments are not limited to any specific combination of hardware circuitry and/or software.

The term "computer-usable medium," as used herein, refers to any medium that provides information or is usable by the processor(s) 1407. Such a medium may take many forms, including, but not limited to, non-volatile, volatile and transmission media. Non-volatile media, i.e., media that can retain information in the absence of power, includes the ROM 1409, CD ROM, magnetic tape, and magnetic discs. Volatile media, i.e., media that can not retain information in the absence of power, includes the main memory 1408. Transmission media includes coaxial cables, copper wire and fiber optics, including the wires that comprise the bus 1406. Transmission media can also take the form of carrier waves; i.e., electromagnetic waves that can be modulated, as in frequency, amplitude or phase, to transmit information signals. Additionally, transmission media can take the form of acoustic or light waves, such as those generated during radio wave and infrared data communications.

In the foregoing specification, the embodiments have been described with reference to specific elements thereof. It will, however, be evident that various modifications and changes may be made thereto without departing from the broader spirit and scope. For example, the reader is to understand that the specific ordering and combination of process actions shown in the process flow diagrams described herein is merely illustrative, and that using different or additional process actions, or a different combination or ordering of process actions can be used to enact the embodiments. The specification and drawings are, accordingly, to be regarded in an illustrative rather than restrictive sense.

We claim:

1. A computerized method for modeling variations in circuit parameters in delay calculations for timing analysis of circuit designs comprising:
   characterizing the circuit design at each of the set of predetermined circuit parameter values, each of the parameter values being within a range, the characterization results for each parameter value being stored on computer readable medium;
   deriving an equation for calculating an output waveform of the circuit design based on the stored circuit characterization results;
   calculating the output waveform to extract a delay at a given input parameter value using the derived equation, the given input parameter value being any value within the range; and
   storing a value of the delay in a computer readable tangible medium for use in electronic design automation.

2. The method of claim 1, where the predetermined circuit parameter values and the given input parameter value can be any one of supply voltage, temperature, and process, process representing a collection of parameters including oxide thickness, threshold voltage, transistor width, and transistor length.

3. The method of claim 2, wherein the set of predetermined parameter values comprises no more than three values.

4. The method of claim 2, wherein deriving the equation comprises:
   inputting a slew, a load capacitance, and the given input parameter value;
   obtaining a driving current value from the characterization results of each parameter value in the set of predetermined parameters based on the slew and load capacitance;
   forming an equation for each of the obtained driving current values; and
   solving for a set of unknown coefficients in the formed equations.

5. The method of claim 4, wherein the predetermined circuit parameter values and the given input parameter value are supply voltage.

6. The method if claim 4, wherein the equation is $$i_d = \frac{\beta}{2}[V - V_{th0}]^q,$$

where $i_d$ is the obtained driving current, and $\beta$, $V_{tho}$, and q are the unknown coefficients.

7. The method of claim 6, wherein calculating the waveform and the delay at a given input parameter value using the derived equation, comprises
   entering the given input parameter supply voltage, V, into the equation;
   entering the solved coefficients into the equation; and
   solving the equation.

8. The method of claim 1, wherein the characterization results for each parameter value comprise the delay value and a plurality of points forming the output waveform.

9. The method of claim 1 wherein the set of predetermined parameter values comprises no more than six value pairs, each value pair comprising one each of any two of supply voltage, temperature, and process, process representing a collection of parameters including oxide thickness, threshold voltage, transistor width and transistor length.

10. The method of claim 9, wherein deriving the equation comprises:
inputting a slew, a load capacitance, and the two given input parameter values;
obtaining a driving current value from the characterization results of each parameter value in the set of predetermined parameters based on the slew and load capacitance;
forming an equation for each of the obtained driving current values; and
solving for a set of unknown coefficients in the formed equations.

11. The method of claim 10, wherein the value pair is comprised of supply voltage and temperature.

12. The method of claim 11, wherein the equation is $$i_d = \frac{\beta}{2}\left(\frac{T}{Tnom}\right)^P [V - Vtho - \delta(T - Tnom)]^q,$$

where $i_d$ is the obtained driving current, and $\beta$, $V_{tho}$, q, P, Tnom, and $\delta$ are the unknown coefficients.

13. The method of claim 12, wherein calculating the waveform and the delay at a given input parameter value using the derived equation, comprises:
entering the given input parameter supply voltage, V, and given input parameter temperature, T, into the equation;
entering the solved coefficients into the equation; and
solving the equation based on the given input parameters.

14. A circuit design formed by the method of claim 1.

15. A computerized method for modeling variations in circuit parameters in delay calculations for timing analysis of circuit designs comprising:
characterizing the circuit design at each of the set of predetermined circuit parameter values, each of the parameter values being within a range, the characterization results for each parameter value being stored on computer readable medium;
deriving an equation for calculating an output waveform of the circuit design based on the stored circuit characterization results;
modeling the output waveform to extract a delay at a given input parameter value using the derived equation, the input parameter value being any value within the range; and
storing a value of the delay in a computer readable tangible medium for use in electronic design automation.

16. A computer program product embodied on computer readable medium, the computer readable medium having stored thereon a sequence of instructions which, when executed by a processor, causes the processor to execute a method for modeling variations in circuit parameters in delay calculations for timing analysis of circuit designs, the method comprising:
characterizing the circuit design at each of the set of predetermined circuit parameter values, each of the parameter values being within a range, the characterization results for each parameter value being stored on computer readable medium;
deriving an equation for calculating an output waveform of the circuit design based on the stored circuit characterization results;
calculating the output waveform to extract a delay at a given input parameter value using the derived equation, the given input parameter value being any value within the range; and
storing a value of the delay in a computer readable tangible medium for use in electronic design automation.

17. The computer program of claim 16, where the predetermined circuit parameter values and the given input parameter value can be any one of supply voltage, temperature, and process, process representing a collection of parameters including oxide thickness, threshold voltage, transistor width, and transistor length.

18. The computer program of claim 17, wherein the set of predetermined parameter values comprises no more than three values.

19. The computer program of claim 17, wherein deriving the equation comprises:
inputting a slew, a load capacitance, and the given input parameter value;
obtaining a driving current value from the characterization results of each parameter value in the set of predetermined parameters based on the slew and load capacitance;
forming an equation for each of the obtained driving current values; and
solving for a set of unknown coefficients in the formed equations.

20. The computer program of claim 19, wherein the predetermined circuit parameter values and the given input parameter value are supply voltage.

21. The computer program if claim 20, wherein the equation is $$i_d = \frac{\beta}{2}[V - V_{th0}]^q,$$

where $i_d$ is the obtained driving current, and $\beta$, $V_{tho}$, and q are the unknown coefficients.

22. The computer program of claim 21, wherein calculating the waveform and the delay at a given input parameter value using the derived equation, comprises:
entering the given input parameter supply voltage, V, into the equation;
entering the solved coefficients into the equation; and
solving the equation.

23. The computer program of claim 16, wherein the characterization results for each parameter value comprise the delay value and a plurality of points forming the output waveform.

24. The computer program of claim 16, wherein the set of predetermined parameter values comprises no more than six value pairs, each value pair comprising one each of any two of supply voltage, temperature, and process, process representing a collection of parameters including oxide thickness, threshold voltage, transistor width and transistor length.

25. The computer program of claim 24, wherein deriving the equation comprises:

inputting a slew, a load capacitance, and the two given input parameter values;

obtaining a driving current value from the characterization results of each parameter value in the set of predetermined parameters based on the slew and load capacitance;

forming an equation for each of the obtained driving current values; and solving for a set of unknown coefficients in the formed equations.

26. The computer program of claim 25, wherein the value pair is comprised of supply voltage and temperature.

27. The computer program of claim 26, wherein the equation is $$i_d = \frac{\beta}{2}\left(\frac{T}{Tnom}\right)^P [V - Vtho - \delta(T - Tnom)]^q,$$

where $i_d$ is the obtained driving current, and $\beta$, $V_{tho}$, q, P, Tnom, and $\delta$ are the unknown coefficients.

28. The computer program of claim 27, wherein calculating the waveform and the delay at a given input parameter value using the derived equation, comprises:

entering the given input parameter supply voltage, V, and given input parameter temperature, T, into the equation;

entering the solved coefficients into the equation; and solving the equation based on the given input parameters.

29. A system for modeling variations in circuit parameters in delay calculations for timing analysis of circuit designs comprising:

logic for characterizing the circuit design at each of the set of predetermined circuit parameter values, each of the parameter values being within a range, the characterization results for each parameter value being stored on computer readable medium;

logic for deriving an equation for calculating an output waveform of the circuit design based on the stored circuit characterization results;

logic for calculating the output waveform to extract a delay at a given input parameter value using the derived equation, the given input parameter value being any value within the range; and logic for storing a value of the delay in a computer readable tangible medium for use in electronic design automation.

30. The system of claim 29, where the predetermined circuit parameter values and the given input parameter value can be any one of supply voltage, temperature, and process, process representing a collection of parameters including oxide thickness, threshold voltage, transistor width, and transistor length.

31. The system of claim 29, wherein the set of predetermined parameter values comprises no more than three values.

32. The system of claim 30, wherein logic for deriving the equation comprises:

logic for inputting a slew, a load capacitance, and the given input parameter value;

logic for obtaining a driving current value from the characterization results of each parameter value in the set of predetermined parameters based on the slew and load capacitance;

logic for forming an equation for each of the obtained driving current values; and logic for solving for a set of unknown coefficients in the formed equations.

33. The system of claim 32, wherein the predetermined circuit parameter values and the given input parameter value are supply voltage.

34. The system if claim 33, wherein the equation is $$i_d = \frac{\beta}{2}[V - V_{th0}]^q,$$

where $i_d$ is the obtained driving current, and $\beta$, $V_{tho}$, and q are the unknown coefficients.

35. The system of claim 34, wherein logic for calculating the waveform and the delay at a given input parameter value using the derived equation, comprises:

logic for entering the given input parameter supply voltage, V, into the equation;

logic for entering the solved coefficients into the equation; and logic for solving the equation.

36. The system of claim 29, wherein the characterization results for each parameter value comprise the delay value and a plurality of points forming the output waveform.

37. The system of claim 29 wherein the set of predetermined parameter values comprises no more than six value pairs, each value pair comprising one each of any two of supply voltage, temperature, and process, process representing a collection of parameters including oxide thickness, threshold voltage, transistor width and transistor length.

38. The system of claim 37, wherein logic for deriving the equation comprises:

logic for inputting a slew, a load capacitance, and the two given input parameter values;

logic for obtaining a driving current value from the characterization results of each parameter value in the set of predetermined parameters based on the slew and load capacitance;

logic for forming an equation for each of the obtained driving current values; and logic for solving for a set of unknown coefficients in the formed equations.

39. The system of claim 38, wherein the value pair is comprised of supply voltage and temperature.

40. The system of claim 39, wherein the equation is $$i_d = \frac{\beta}{2}\left(\frac{T}{Tnom}\right)^P [V - Vtho - \delta(T - Tnom)]^q,$$

where $i_d$ is the obtained driving current, and $\beta$, $V_{tho}$, q, P, Tnom, and $\delta$ are the unknown coefficients.

41. The system of claim 40, wherein logic for calculating the waveform and the delay at a given input parameter value using the derived equation, comprises:

logic for entering the given input parameter supply voltage, V, and given input parameter temperature, T, into the equation;

logic for entering the solved coefficients into the equation; and logic for solving the equation based on the given input parameters.

* * * * *